(12) United States Patent
Honda et al.

(10) Patent No.: US 11,901,867 B2
(45) Date of Patent: Feb. 13, 2024

(54) DIFFERENTIAL AMPLIFIER CIRCUIT

(71) Applicant: Murata Manufacturing Co., Ltd., Kyoto (JP)

(72) Inventors: Yuri Honda, Kyoto (JP); Jun Enomoto, Kyoto (JP); Fumio Harima, Kyoto (JP); Satoshi Tanaka, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 336 days.

(21) Appl. No.: 17/350,385

(22) Filed: Jun. 17, 2021

(65) Prior Publication Data

US 2021/0399701 A1    Dec. 23, 2021

(30) Foreign Application Priority Data

Jun. 19, 2020   (JP) .................. 2020-106255

(51) Int. Cl.
*H03F 3/45*    (2006.01)
*H03F 3/193*   (2006.01)

(52) U.S. Cl.
CPC ......... *H03F 3/45076* (2013.01); *H03F 3/193* (2013.01); *H03F 2200/451* (2013.01); *H03F 2200/534* (2013.01); *H03F 2200/537* (2013.01); *H03F 2200/541* (2013.01); *H03F 2203/45644* (2013.01)

(58) Field of Classification Search
CPC ............... H03F 3/45076; H03F 3/193; H03F 2200/451; H03F 2200/534; H03F 2200/537; H03F 2200/541; H03F 2203/45644; H03F 3/217; H03F 3/265; H03F 3/45071; H03F 3/195; H03F 1/565; H03F 3/19; H03F 3/211
USPC ......................................................... 330/252
See application file for complete search history.

(56) References Cited

U.S. PATENT DOCUMENTS

| | | | |
|---|---|---|---|
| 8,269,561 B1 * | 9/2012 | Park ........................ | H03F 3/211 |
| | | | 330/301 |
| 9,584,076 B2 * | 2/2017 | Ortiz ...................... | H03F 1/0205 |
| 10,411,660 B1 | 9/2019 | Ortiz et al. | |

* cited by examiner

*Primary Examiner* — Andrea Lindgren Baltzell
*Assistant Examiner* — Khiem D Nguyen
(74) *Attorney, Agent, or Firm* — Pearne & Gordon LLP

(57) ABSTRACT

A differential amplifier circuit includes a first and second amplifiers that output a differential signal in a radio-frequency band, a first inductor having a first end connected to an output end of the first amplifier, a second inductor having a first end connected to an output end of the second amplifier, a choke inductor connected to second ends of the first and second inductors, a first and second capacitors, and a switch that connects the second capacitor in parallel to the first capacitor or terminates a parallel connection of the first and second capacitors. A resonant circuit formed by connecting the first or second inductor in series with the first capacitor has a different resonant frequency from a resonant circuit formed by connecting the first or second inductor in series with the parallel-connected first and second capacitors. These resonant frequencies correspond to second harmonic frequencies of the differential signal.

20 Claims, 15 Drawing Sheets

DIFFERENTIAL AMPLIFIER CIRCUIT

CROSS REFERENCE TO RELATED APPLICATION

This application claims priority from Japanese Patent Application No. 2020-106255 filed on Jun. 19, 2020. The content of this application is incorporated herein by reference in its entirety.

BACKGROUND OF THE DISCLOSURE

1. Field of the Disclosure

The present disclosure relates to a differential amplifier circuit.

2. Description of the Related Art

U.S. Pat. No. 10,411,660 discloses a differential amplifier circuit including a pair of differential amplifiers that output a differential signal. The differential amplifier circuit disclosed in U.S. Pat. No. 10,411,660 includes a transformer on the input side of the pair of differential amplifiers for unbalanced-to-balanced conversion. The differential amplifier circuit further includes a transformer on the output side of the pair of differential amplifiers for balanced-to-unbalanced conversion.

To reduce power consumption, it is desirable to cause a differential amplifier to operate in a class-F mode. To achieve an ideal class-F operation, it is desirable that the output voltage of the differential amplifier have a waveform similar to a rectangular waveform. In this case, it is necessary to prevent a second harmonic from being outputted without affecting a fundamental signal. For example, a load impedance short-circuited for even harmonics including the second harmonic and open-circuited for odd harmonics including the third harmonic is used to achieve an ideal class-F operation. The differential amplifier circuit disclosed in U.S. Pat. No. 10,411,660 is susceptible to improvement in preventing second harmonics from being outputted without affecting fundamental signals of the differential signal.

BRIEF SUMMARY OF THE DISCLOSURE

Accordingly, it is an object of the present disclosure to provide a differential amplifier circuit that prevents second harmonics from being outputted without affecting fundamental signals of a differential signal.

According to preferred embodiments of the present disclosure, a differential amplifier circuit includes a first amplifier and a second amplifier that output a differential signal in a radio-frequency band; a first inductor having a first end connected to an output end of the first amplifier, and a second end; a second inductor having a first end connected to an output end of the second amplifier, and a second end, the second end of the first inductor and the second end of the second inductor being connected to each other; a choke inductor connected to the second end of the first inductor and the second end of the second inductor; a first capacitor having a first end connected to the second end of the first inductor and the second end of the second inductor, and a second end connected to a reference potential; a second capacitor; and a switch that connects the second capacitor in parallel to the first capacitor or terminates a parallel connection of the first capacitor and the second capacitor. The first inductor or the second inductor is connected in series with the first capacitor to form a resonant circuit having a first resonant frequency, and the first inductor or the second inductor is connected in series with the first capacitor and the second capacitor that are connected in parallel to form a resonant circuit having a second resonant frequency, the first resonant frequency and the second resonant frequency being different from each other. The first resonant frequency and the second resonant frequency correspond to second harmonic frequencies of the differential signal.

According to preferred embodiments of the present disclosure, a differential amplifier circuit includes a first amplifier and a second amplifier that output a differential signal in a radio-frequency band; a first inductor having a first end connected to an output end of the first amplifier, and a second end; a second inductor having a first end connected to an output end of the second amplifier, and a second end, the second end of the first inductor and the second end of the second inductor being connected to each other; a choke inductor connected to the second end of the first inductor and the second end of the second inductor; a first capacitor having a first end connected to the second end of the first inductor and the second end of the second inductor, and a second end connected to a reference potential; a first series resonant circuit having a first end connected to the output end of the first amplifier, and a second end connected to the reference potential; and a second series resonant circuit having a first end connected to the output end of the second amplifier, and a second end connected to the reference potential. Each of the first series resonant circuit and the second series resonant circuit includes an inductor and a capacitor that are connected in series. The first inductor or the second inductor is connected in series with the first capacitor to form a resonant circuit having a first resonant frequency, and each of the first series resonant circuit and the second series resonant circuit has a second resonant frequency, the first resonant frequency and the second resonant frequency being different from each other. The first resonant frequency and the second resonant frequency correspond to second harmonic frequencies of the differential signal.

According to preferred embodiments of the present disclosure, a differential amplifier circuit includes a first amplifier and a second amplifier that output a differential signal in a radio-frequency band; a first inductor having a first end connected to an output end of the first amplifier, and a second end; a second inductor having a first end connected to an output end of the second amplifier, and a second end, the second end of the first inductor and the second end of the second inductor being connected to each other; a choke inductor connected to the second end of the first inductor and the second end of the second inductor; a third inductor disposed in parallel to the first inductor and the second inductor, the third inductor having a first end connected to the output end of the first amplifier, and a second end connected to the output end of the second amplifier; a first capacitor having a first end connected to a midpoint of the third inductor, and a second end connected to a reference potential; a transformer having a primary winding and a secondary winding that are electromagnetically coupled to each other, the transformer being configured to perform balanced-to-unbalanced conversion, the primary winding of the transformer being used to implement the first inductor and the second inductor; and a series resonant circuit including one half of the third inductor, and the first capacitor.

According to preferred embodiments of the present disclosure, a differential amplifier circuit can prevent second harmonics from being outputted without affecting fundamental signals of a differential signal. Other features, elements, characteristics and advantages of the present disclosure will become more apparent from the following detailed description of preferred embodiments of the present disclosure with reference to the attached drawings.

DETAILED DESCRIPTION OF THE DISCLOSURE

The following describes differential amplifier circuits according to embodiments of the present disclosure in detail with reference to the drawings. It should be noted that the present disclosure is not limited by the embodiments. Constituent elements in the embodiments include those that are replaceable and easily made by a person skilled in the art, or those that are substantially the same. The embodiments are illustrative, and elements presented in different embodiments may be partially replaced or combined. Features common to a first embodiment will not be described in a second embodiment and the subsequent embodiments, and only differences will be described. In particular, similar operations and effects achieved with similar configurations will not be described again in the individual embodiments.

For easy understanding of the individual embodiments, a description will be given first of a power amplifier circuit according to a comparative example that does not include a resonant circuit for preventing a second harmonic from being outputted.

COMPARATIVE EXAMPLE

Configuration

Figure 1:
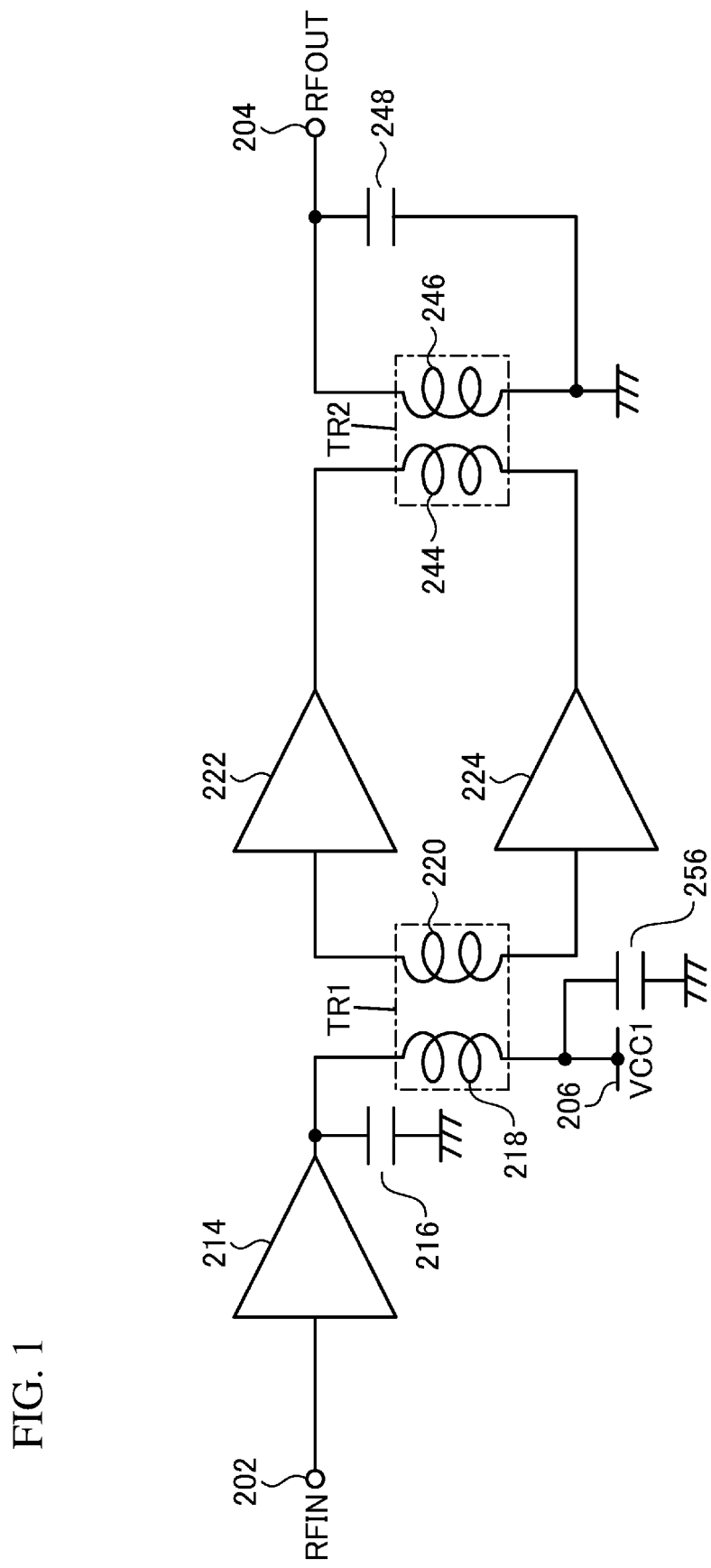
FIG. 1 is a diagram illustrating an example of a power amplifier circuit according to a comparative example.

FIG. 1 is a diagram illustrating an example of a power amplifier circuit according to a comparative example. The power amplifier circuit illustrated in FIG. 1 includes an input amplifier 214 and amplifiers 222 and 224. The amplifiers 222 and 224 form a differential amplifier circuit.

An input signal RFIN is inputted to an input terminal 202 and is inputted to the input amplifier 214. The output of the input amplifier 214 is connected to one end of an inductor 218. Another end of the inductor 218 is connected to a power supply voltage (VCC1) 206. A capacitor 216 is connected between the output of the input amplifier 214 and a reference potential. A capacitor 256 is connected between the power supply voltage (VCC1) 206 and the reference potential. The reference potential is a ground potential, for example but is not limited thereto.

The inductor 218 is electromagnetically coupled to an inductor 220 to form a transformer TR1. The transformer TR1 performs unbalanced-to-balanced conversion on a signal of the inductor 218, which serves as the primary winding. A signal converted by the transformer TR1 is inputted to the inductor 220, which serves as the secondary winding. The term "electromagnetically coupling" is defined as either magnetic coupling or electric coupling, or both.

One end of the inductor 220 is connected to the input of the amplifier 222, and another end of the inductor 220 is connected to the input of the amplifier 224. The amplifiers 222 and 224 form a differential amplifier. The output of the amplifier 222 and the output of the amplifier 224 are inputted to the subsequent circuit (not illustrated) as a differential signal.

An output end of the amplifier 222 is connected to one end of an inductor 244. An output end of the amplifier 224 is connected to another end of the inductor 244. The inductor 244 is electromagnetically coupled to an inductor 246 to form a transformer TR2. The transformer TR2 performs balanced-to-unbalanced conversion on a signal of the inductor 244, which serves as the primary winding. The inductor 246 has one end connected to an output terminal 204, and another end connected to the reference potential. The one end of the inductor 246 is connected to the reference potential via a capacitor 248. An output signal RFOUT is outputted from the output terminal 204.

In this comparative example, the transformer TR1 is disposed on the input side of the amplifiers 222 and 224, which form the differential amplifier circuit, and the transformer TR2 is disposed on the output side of the amplifiers 222 and 224. The transformer TR1 operates as a balun that performs unbalanced-to-balanced conversion. The transformer TR2 operates as a balun that performs balanced-to-unbalanced conversion.

Operation

A signal inputted to the input terminal 202, for example, a radio frequency (RF) signal, is amplified by the input amplifier 214, and the amplified signal is inputted to the transformer TR1. The transformer TR1 produces a differential signal, and the differential signal is amplified by the amplifiers 222 and 224. The outputs of the amplifiers 222 and 224 are supplied to the transformer TR2, through which the differential signal is converted into an unbalanced signal, and the unbalanced signal is outputted to the output terminal 204.

First Embodiment

To achieve an ideal class-F operation of a differential amplifier circuit, it is desirable not to output even harmonics that are in phase with a fundamental signal. In particular, the second harmonic is not outputted, thereby achieving the operation of a differential amplifier circuit that is close to an ideal class-F operation. A resonant circuit having a desired resonant frequency is used to terminate the second harmonic. It is therefore possible to prevent the second harmonic from being outputted.

Configuration

Figure 2:
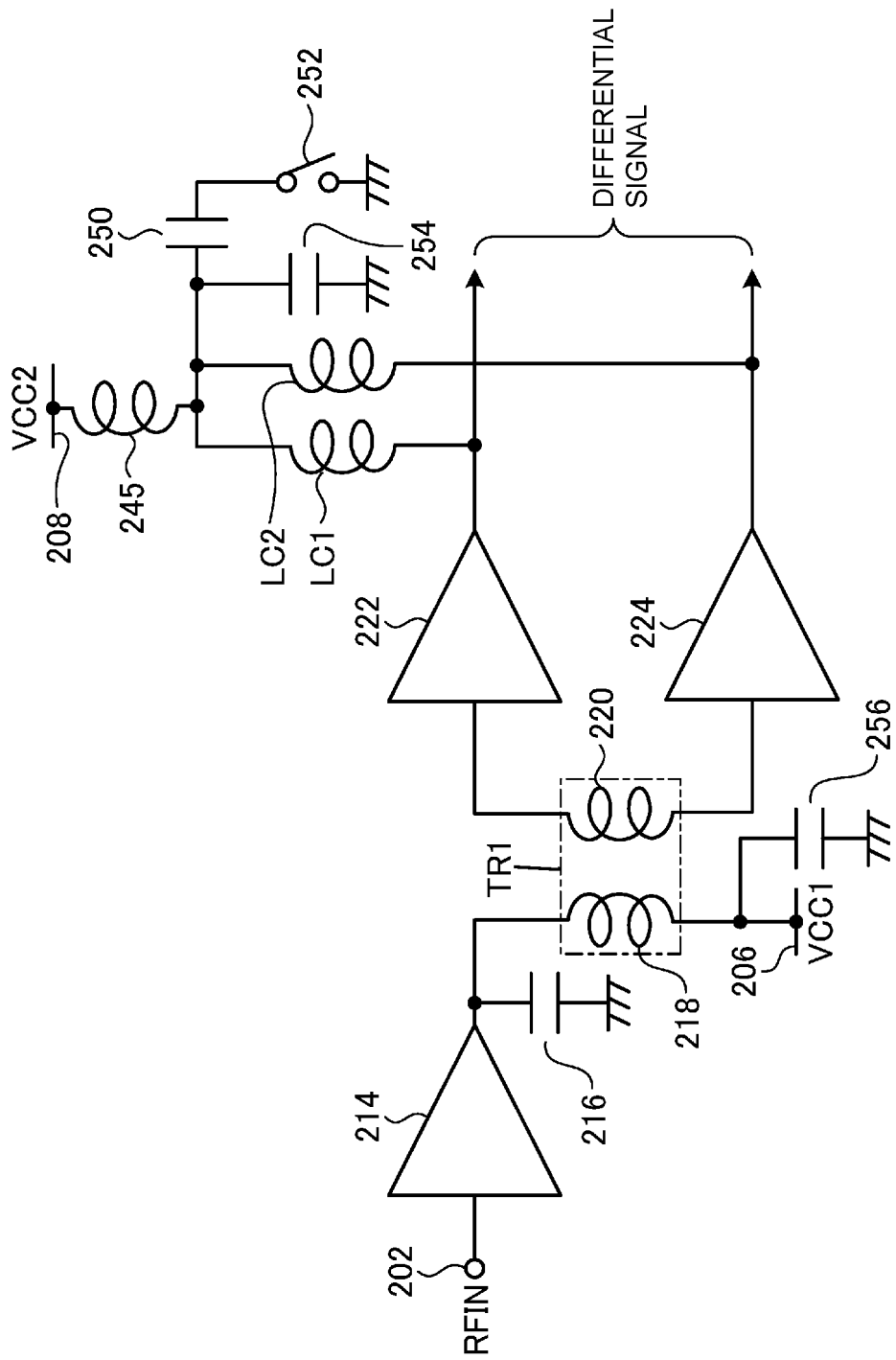
FIG. 2 is a diagram illustrating a differential amplifier circuit according to a first embodiment of the present disclosure.

FIG. 2 is a diagram illustrating a differential amplifier circuit according to a first embodiment of the present disclosure. To increase the frequency bandwidth over which the differential amplifier circuit operates, it is necessary to set the output load impedances of the amplifiers 222 and 224 in the power stage to desired impedances. For example, to achieve the class-F operation, a load impedance needs to be short-circuited at a second harmonic frequency. In an embodiment of the present disclosure, accordingly, resonant circuits are disposed at the output ends of the amplifiers 222 and 224 to prevent the second harmonic from being outputted. FIG. 2 illustrates an example of resonant circuits provided for the pair of amplifiers 222 and 224 that output a differential signal.

In FIG. 2, the output end of the amplifier 222 is connected to one end of an inductor LC1. The output end of the amplifier 224 is connected to one end of an inductor LC2. Another end of the inductor LC1 and another end of the inductor LC2 are connected to each other, and are further connected to one end of a capacitor 250 and one end of a capacitor 254. Another end of the capacitor 254 is connected to the reference voltage. Ideally, the inductors LC1 and LC2 have the same inductance value. The capacitors 250 and 254 are connected to a node, or a midpoint, of the inductors LC1 and LC2 having the same inductance value. With this configuration, the capacitors 250 and 254 do not affect the fundamental signal. The values of the inductors LC1 and LC2 are defined to be equal if the values are within a range of manufacturing errors.

Another end of the capacitor 250 is connected to the reference voltage via a switch 252. When the switch 252 is in the on state, the other end of the capacitor 250 is connected to the reference voltage. When the switch 252 is in the off state, the other end of the capacitor 250 is not connected to the reference voltage. That is, when the switch 252 is in the off state, the parallel connection of the capacitors 254 and 250 is terminated. For example, in a case where the operating frequencies of the amplifiers 222 and 224 are low, the switch 252 is brought into the on state such that a large capacitance value of the capacitors 254 and 250 that are connected in parallel is used. In a case where the operating frequencies of the amplifiers 222 and 224 are high, in contrast, the switch 252 is brought into the off state such that a small capacitance value of only the capacitor 254 is used without using the capacitance value of the capacitor 250. The switch 252 can be implemented by a transistor, for example. The switch 252 is controlled to turn on or off in accordance with the operating frequencies of the amplifiers 222 and 224.

The other end of the inductor LC1 is connected to a power supply voltage (VCC2) 208 via a choke inductor 245. The other end of the inductor LC2 is connected to the power supply voltage (VCC2) 208 via the choke inductor 245. Thus, power is fed to transistors (not illustrated) in the output stage of the amplifiers 222 and 224 via the inductors LC1 and LC2. The choke inductor 245 does not contribute to the resonance operation.

Operation

The resonant frequency determined by the inductance value of the inductor LC1 and the capacitance value of the capacitor 254 is set to be equal to the second harmonic frequency of the output of the amplifier 222, thereby preventing the second harmonic of the frequency of the output of the amplifier 222 from being outputted. That is, with the use of a series resonant circuit formed by the inductor LC1 and the capacitor 254, the load impedance seen from the output end of the amplifier 222 is short-circuited at the resonant frequency. An ideal short-circuit is 0 Ω. The term "short-circuit", as used herein, is defined as a state in which the impedance value is less than or equal to Z0/5 Ω, where Z0 denotes the impedance value (expressed in Ω) at the fundamental. It is therefore possible to prevent the second harmonic of the frequency of the output of the amplifier 222 from being outputted by using the series resonant circuit formed by the inductor LC1 and the capacitor 254.

The resonant frequency determined by the inductance value of the inductor LC2 and the capacitance value of the capacitor 254 is set to be equal to the second harmonic frequency of the output of the amplifier 224, thereby preventing the second harmonic of the frequency of the output of the amplifier 224 from being outputted. That is, with the use of a series resonant circuit formed by the inductor LC2 and the capacitor 254, the load impedance seen from the output end of the amplifier 224 is short-circuited at the resonant frequency. It is therefore possible to prevent the second harmonic of the frequency of the output of the amplifier 224 from being outputted by using the series resonant circuit formed by the inductor LC2 and the capacitor 254.

In addition, the capacitance value of the capacitor 250 is added by setting the switch 252 to the on state, and, as a result, another resonant frequency can be set. That is, when the switch 252 is in the on state, the load impedance seen from the output end of the amplifier 222 is short-circuited at a resonant frequency that is set by the inductance value of the inductor LC1 and the composite capacitance value of the parallel-connected capacitors 254 and 250. It is therefore possible to prevent the second harmonic of the frequency of the output of the amplifier 222 from being outputted.

When the switch 252 is in the on state, furthermore, the load impedance seen from the output end of the amplifier 224 is short-circuited at a resonant frequency that is set by the inductance value of the inductor LC2 and the composite capacitance value of the parallel-connected capacitors 254 and 250. It is therefore possible to prevent the second harmonic of the frequency of the output of the amplifier 224 from being outputted.

That is, the load impedances seen from the output ends of the amplifiers 222 and 224 are each short-circuited at two different resonant frequencies in accordance with the on and off states of the switch 252. It is therefore possible to prevent second harmonics of two frequencies from being outputted.

Second Embodiment

Figure 3:
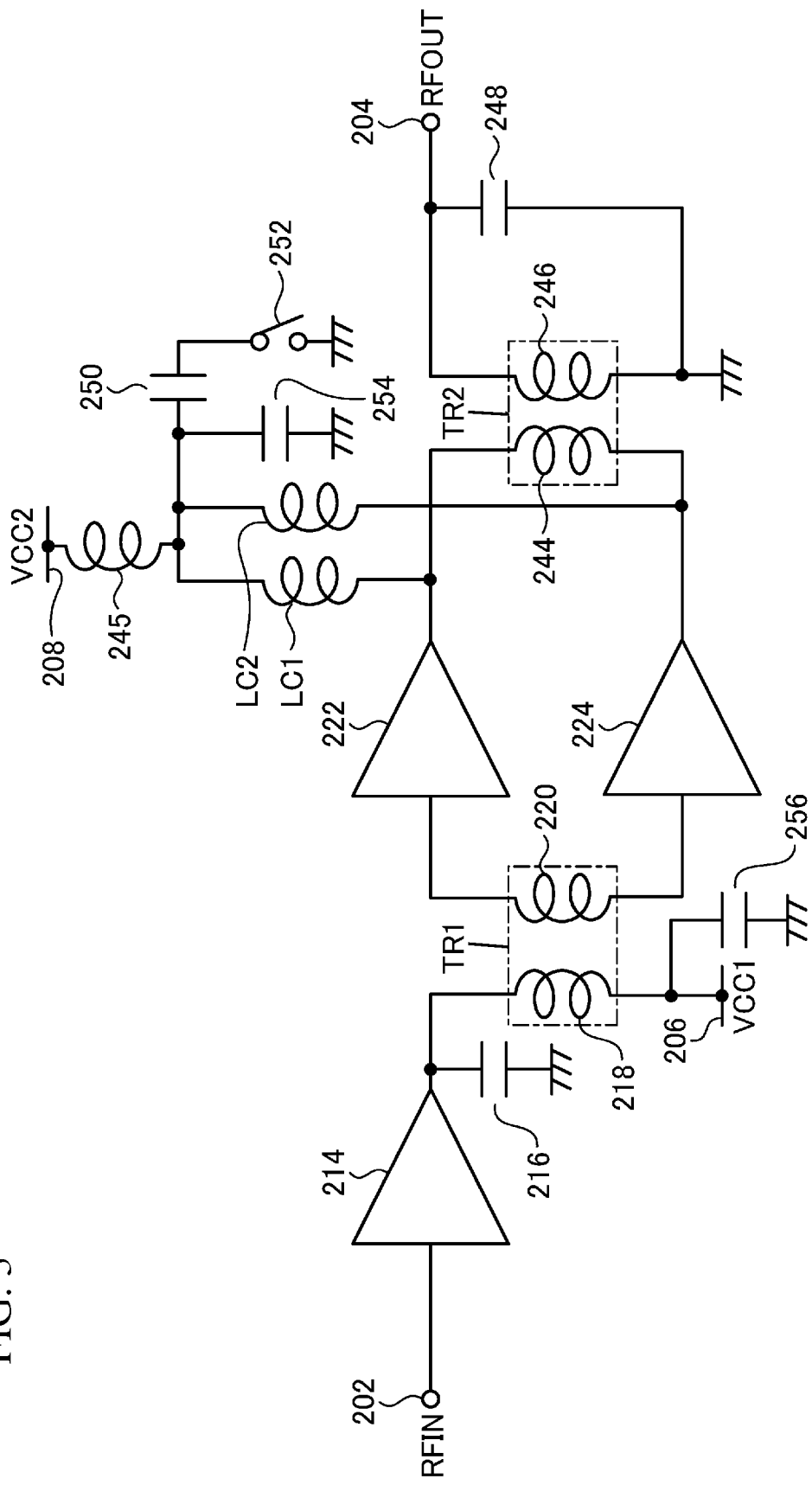
FIG. 3 is a diagram illustrating a differential amplifier circuit according to a second embodiment of the present disclosure.

FIG. 3 is a diagram illustrating a differential amplifier circuit according to a second embodiment of the present disclosure. FIG. 3 illustrates an example in which a subsequent circuit is added to the circuit illustrated in FIG. 2. In the example illustrated in FIG. 3, inductors 244 and 246 and a capacitor 248 are disposed on the output side of the amplifiers 222 and 224, which form a differential amplifier. The inductors 244 and 246 are electromagnetically coupled to each other to form a transformer TR2. The transformer TR2 performs balanced-to-unbalanced conversion on a signal of the inductor 244, which serves as the primary winding. A signal converted by the transformer TR2 is inputted to the inductor 246, which serves as the secondary winding. The inductor 246 is connected to an output terminal 204, and an output signal RFOUT is outputted from the output terminal 204.

In FIG. 3, the inductor LC1 connected to the output end of the amplifier 222, the inductor LC2 connected to the output end of the amplifier 224, the choke inductor 245, the capacitors 254 and 250, and the switch 252 are similar to those in FIG. 2. The capacitors 250 and 254 are connected to the node, or the midpoint, of the inductors LC1 and LC2 having the same inductance value. With this configuration, the capacitors 250 and 254 do not affect the fundamental signal.

In the second embodiment, a differential amplifier circuit having the transformers TR1 and TR2 is provided with resonant circuits formed by the inductor LC1, the inductor LC2, the capacitors 254 and 250, and the switch 252. It is therefore possible to, as in the first embodiment, prevent the second harmonics of the frequencies of the outputs of the amplifiers 222 and 224 from being outputted.

Third Embodiment

Figure 4:
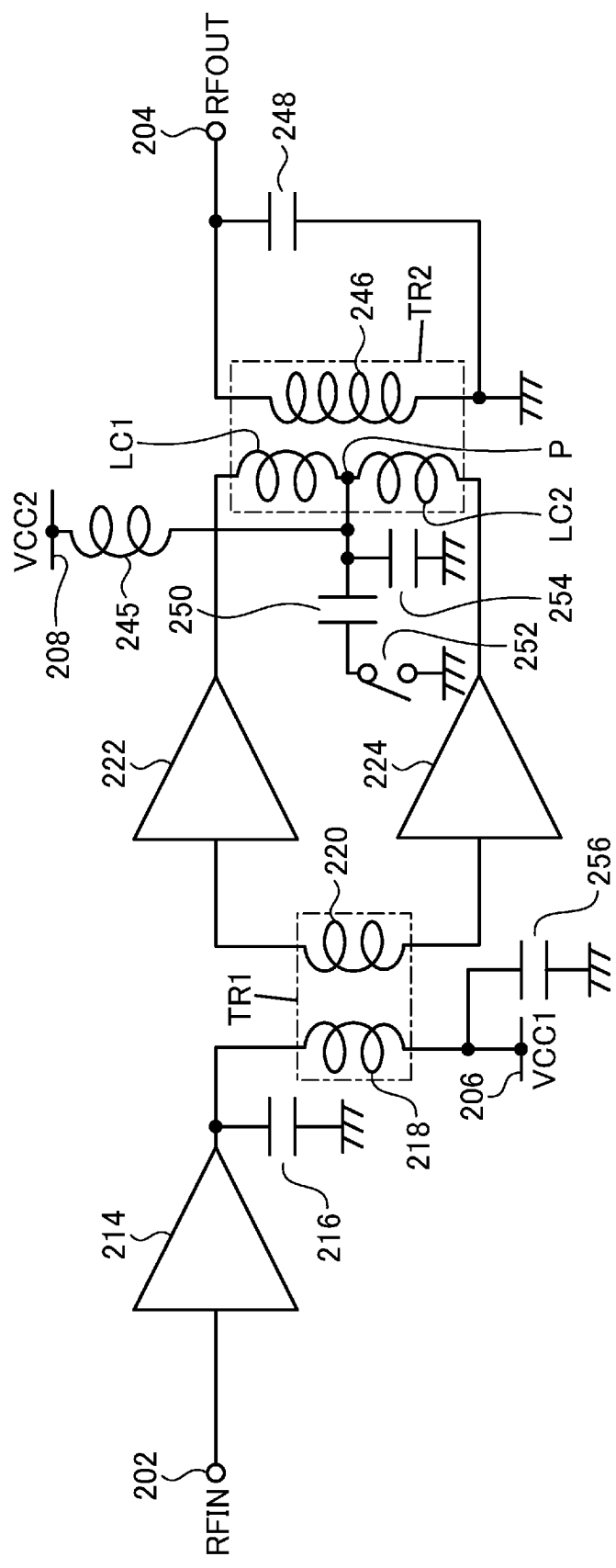
FIG. 4 is a diagram illustrating a differential amplifier circuit according to a third embodiment of the present disclosure.

FIG. 4 is a diagram illustrating a differential amplifier circuit according to a third embodiment of the present disclosure. In FIG. 4, the inductors LC1 and LC2 illustrated in FIG. 2 serve as the primary winding of a transformer. As illustrated in FIG. 4, the inductors LC1 and LC2 serve as the primary winding of the transformer TR2. The inductor 246 serves as the secondary winding of the transformer TR2. That is, the inductors LC1 and LC2 are electromagnetically coupled to the inductor 246 to form the transformer TR2.

As in FIGS. 2 and 3, a midpoint P of the inductors LC1 and LC2, which correspond to the primary winding of the transformer TR2, is connected to the choke inductor 245 and the capacitor 254, and is further connected to the capacitor 250 and the switch 252. The inductor LC1 and the capacitor 254, or the inductor LC1 and the parallel-connected capacitors 254 and 250 form a resonant circuit. Likewise, the inductor LC2 and the capacitor 254, or the inductor LC2 and the parallel-connected capacitors 254 and 250 form a resonant circuit. That is, it is possible to prevent second harmonics of two frequencies from being outputted in accordance with the on and off states of the switch 252.

The midpoint P of the primary winding of the transformer TR2 is in an imaginary short-circuited condition for a fundamental signal of the differential signal. Thus, a component connected to the midpoint P does not affect the fundamental signal. Therefore, the capacitor 254, the capacitor 250, and the switch 252 connected to the midpoint P do not affect the outputs of the amplifiers 222 and 224.

In this manner, a resonant circuit connected to the midpoint P of the transformer TR2 can prevent the second harmonic, which is a harmonic component in phase with a fundamental signal, from being outputted without affecting a fundamental signal of the differential signal. Since the resonant circuit does not affect the fundamental signal of the differential signal, the resonant circuit is designed with high flexibility. For example, even if the second harmonic that is close to the frequency of the fundamental signal is not to be outputted, a resonant circuit connected to the midpoint P can prevent the second harmonic from being outputted without affecting a fundamental signal of the differential signal.

In the differential amplifier circuit according to the third embodiment illustrated in FIG. 4, the inductor 244 illustrated in FIG. 3 can be omitted. Accordingly, the differential amplifier circuit according to the third embodiment can include fewer components than the differential amplifier circuit according to the second embodiment, and can have a smaller area.

Fourth Embodiment

Figure 5:
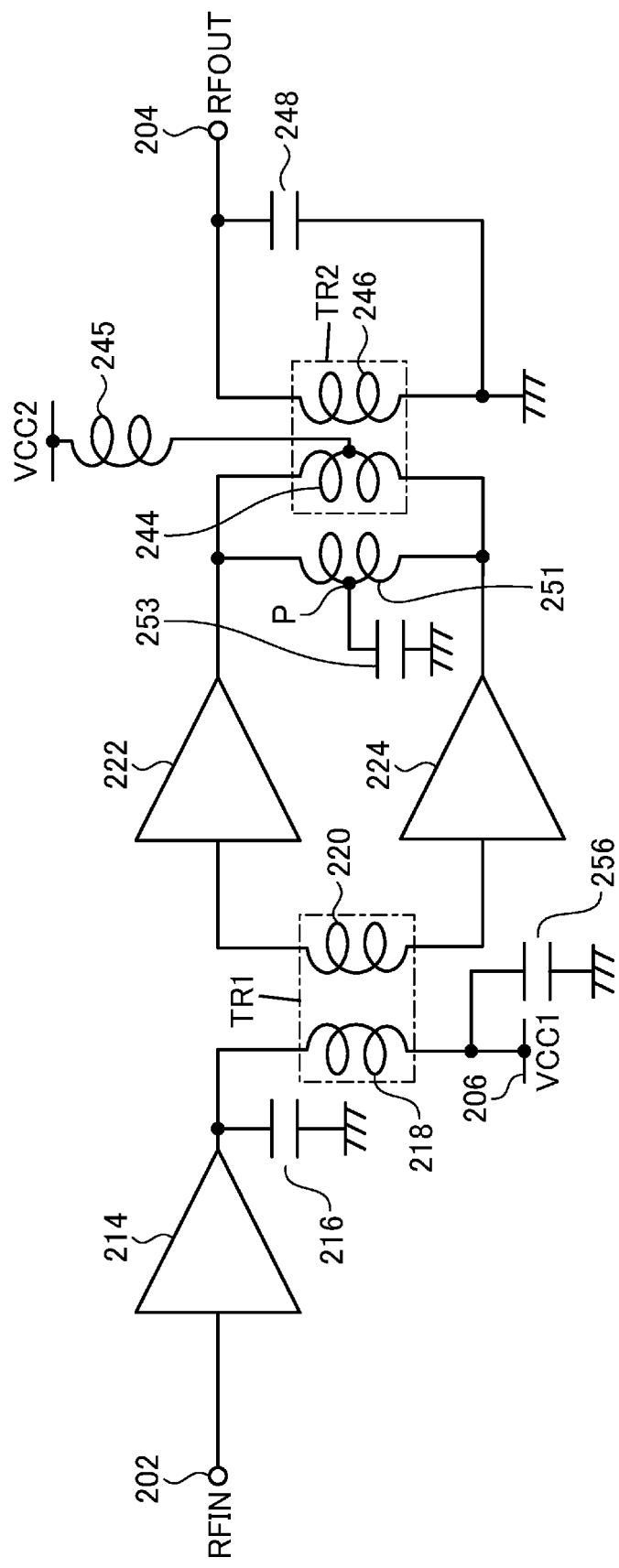
FIG. 5 is a diagram illustrating a differential amplifier circuit according to a fourth embodiment of the present disclosure.

FIG. 5 is a diagram illustrating a differential amplifier circuit according to a fourth embodiment of the present disclosure. As illustrated in FIG. 5, in the fourth embodiment, the choke inductor 245 is connected to a midpoint of the inductor 244, which serves as the primary winding of the transformer TR2. In the fourth embodiment, furthermore, an inductor 251 is disposed between the output of the amplifier 222 and the output of the amplifier 224, separately from the transformer TR2. The inductor 251 is disposed in parallel to the primary winding of the transformer TR2. A midpoint P of the inductor 251 is connected to one end of a capacitor 253, and another end of the capacitor 253 is connected to the reference potential.

As described above, the midpoint P of the inductor 251 is in an imaginary short-circuited condition for a fundamental signal. Therefore, the capacitor 253 connected to the midpoint P does not affect the fundamental signals of the differential signal. It is possible to prevent the second harmonics, which are harmonic components in phase with the fundamental signals, from being outputted by using series resonant circuits of the two halves of the inductor 251 and the capacitor 253.

Fifth Embodiment

Configuration

Figure 6:
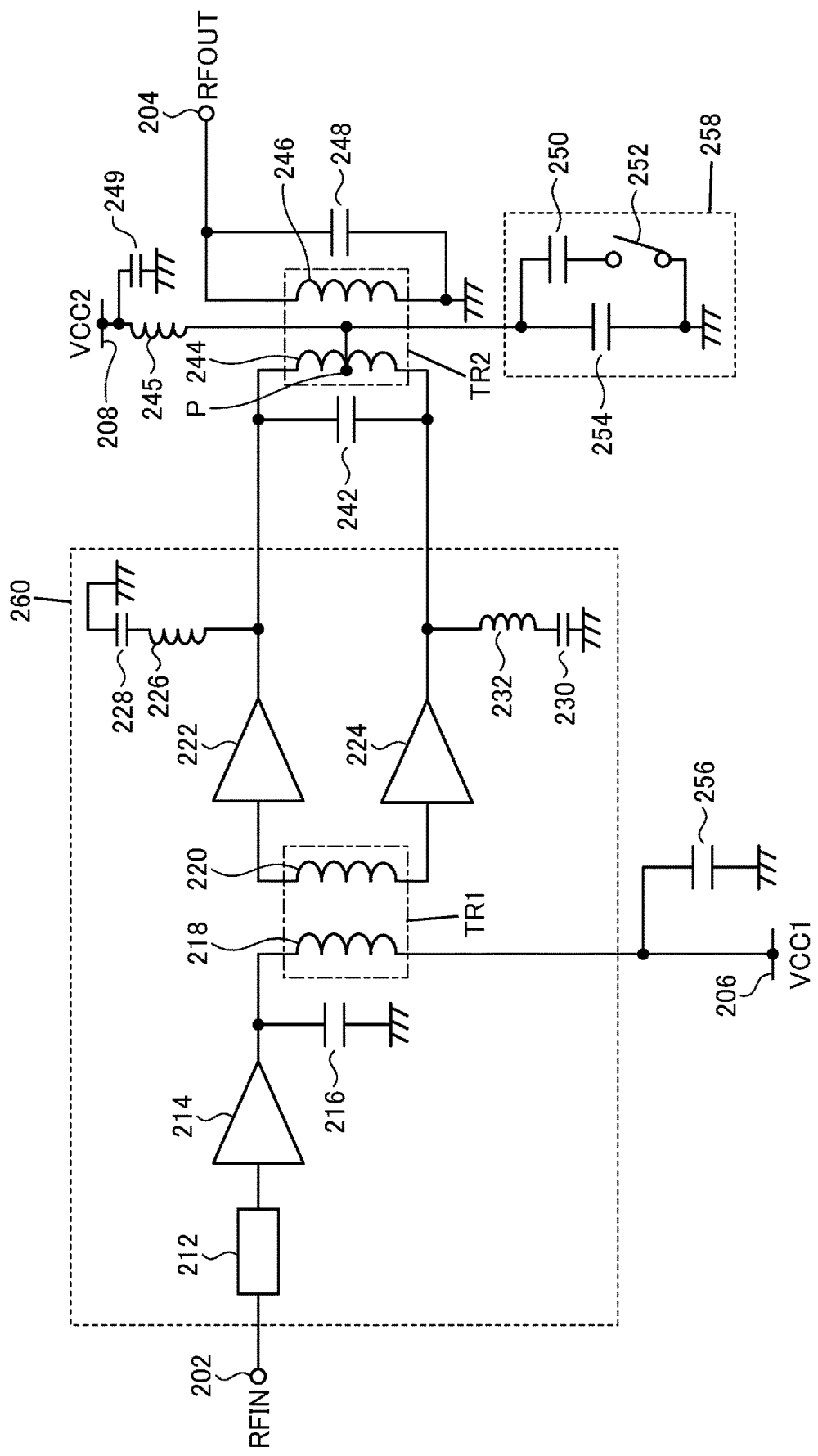
FIG. 6 is a diagram illustrating a differential amplifier circuit according to a fifth embodiment of the present disclosure.

FIG. 6 is a diagram illustrating a differential amplifier circuit according to a fifth embodiment of the present disclosure. FIG. 6 illustrates an example in which some of the constituent elements of a differential amplifier circuit are implemented as a semiconductor chip. In this embodiment, a semiconductor chip 260 includes the input amplifier 214, the transformer TR1, the capacitor 216, and the amplifiers 222 and 224. An input matching circuit 212 is disposed between the input terminal 202 and the input amplifier 214.

In this embodiment, furthermore, the semiconductor chip 260, which includes the amplifiers 222 and 224, also includes series resonant circuits. Specifically, the output end of the amplifier 222 is connected to a series resonant circuit formed by an inductor 226 and a capacitor 228. Further, the output end of the amplifier 224 is connected to a series resonant circuit formed by an inductor 232 and a capacitor 230. In this embodiment, the remaining constituent elements are disposed outside the semiconductor chip 260. In the following description, a section including the capacitor 254, the capacitor 250, and the switch 252 is referred to as a parallel circuit 258.

In the differential amplifier circuit according to this embodiment, when the switch 252 of the parallel circuit 258 is in the off state, the capacitor 250 is not connected in parallel to the capacitor 254. That is, when the switch 252 is in the off state, the parallel connection of the capacitors 254 and 250 is terminated. Accordingly, the load impedances seen from the output ends of the amplifiers 222 and 224 are short-circuited at resonant frequencies set by series resonant circuits formed by the two halves of the inductor 244, and the capacitor 254. Therefore, the second harmonics of the frequencies of the outputs of the amplifiers 222 and 224 are not outputted.

When the switch 252 of the parallel circuit 258 is on state, the capacitors 250 and 254 are connected in parallel. Accordingly, the capacitance value of the parallel circuit 258 is larger than that when the switch 252 is in the off state. At this time, the load impedances seen from the output ends of the amplifiers 222 and 224 are short-circuited at resonant frequencies set by series resonant circuits formed by the two halves of the inductor 244 and the parallel-connected capacitors 254 and 250. Thus, the second harmonics of the frequencies of the outputs of the amplifiers 222 and 224 are not outputted. It is therefore possible to prevent second harmonics of two frequencies from being outputted in accordance with the on and off states of the switch 252 of the parallel circuit 258.

The differential amplifier circuit according to this embodiment further includes a series resonant circuit formed by the inductor 226 and the capacitor 228, and a series resonant circuit formed by the inductor 232 and the capacitor 230. The resonant frequencies of these series resonant circuits are set to frequencies different from those of the resonant circuits formed by the inductor 244 and the parallel circuit 258 described above. As a result, a resonance state is obtained at three different resonant frequencies, and it is possible to prevent second harmonics for two fundamental signals having different frequencies from being outputted.

In addition, the resonant frequency of the series resonant circuit formed by the inductor 226 and the capacitor 228 and the resonant frequency of the series circuit formed by the inductor 232 and the capacitor 230 are each higher than the resonant frequency of a series circuit formed by one half of the inductor 244 and the parallel circuit 258.

Figure 7:
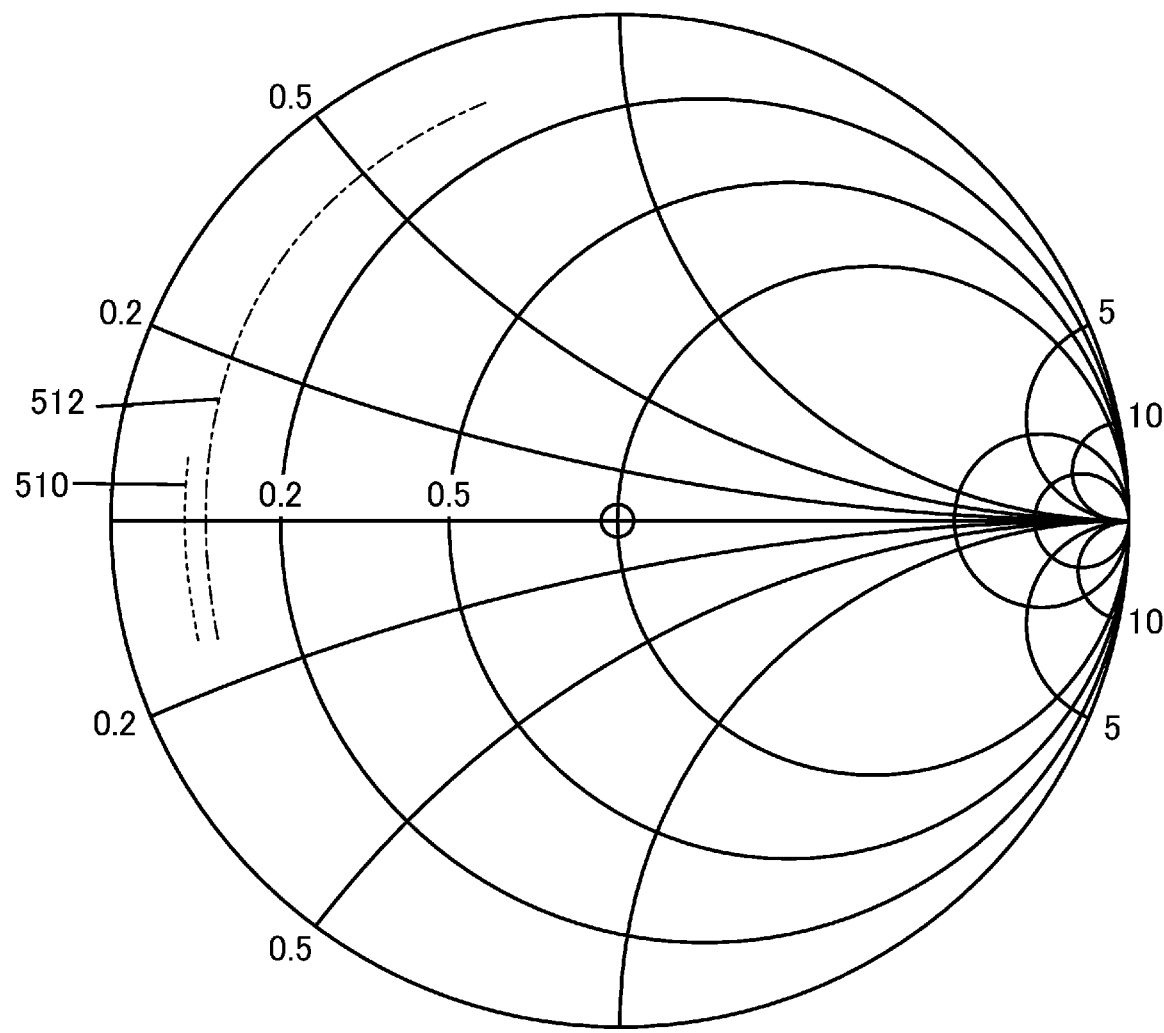
FIG. 7 is a diagram illustrating an example load impedance at a second harmonic.
Figure 8:
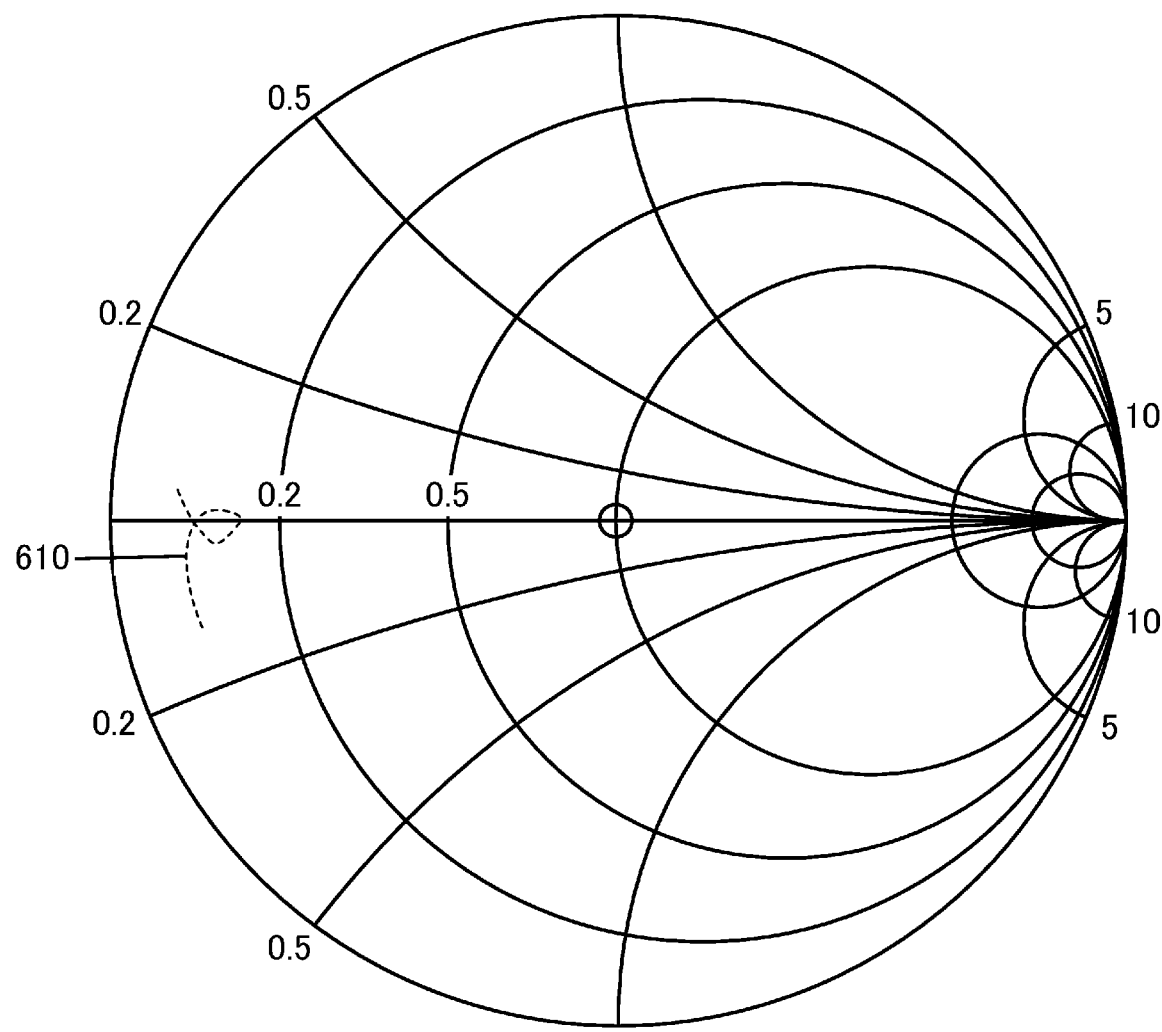
FIG. 8 is a diagram illustrating an example load impedance at a second harmonic.
Figure 9:
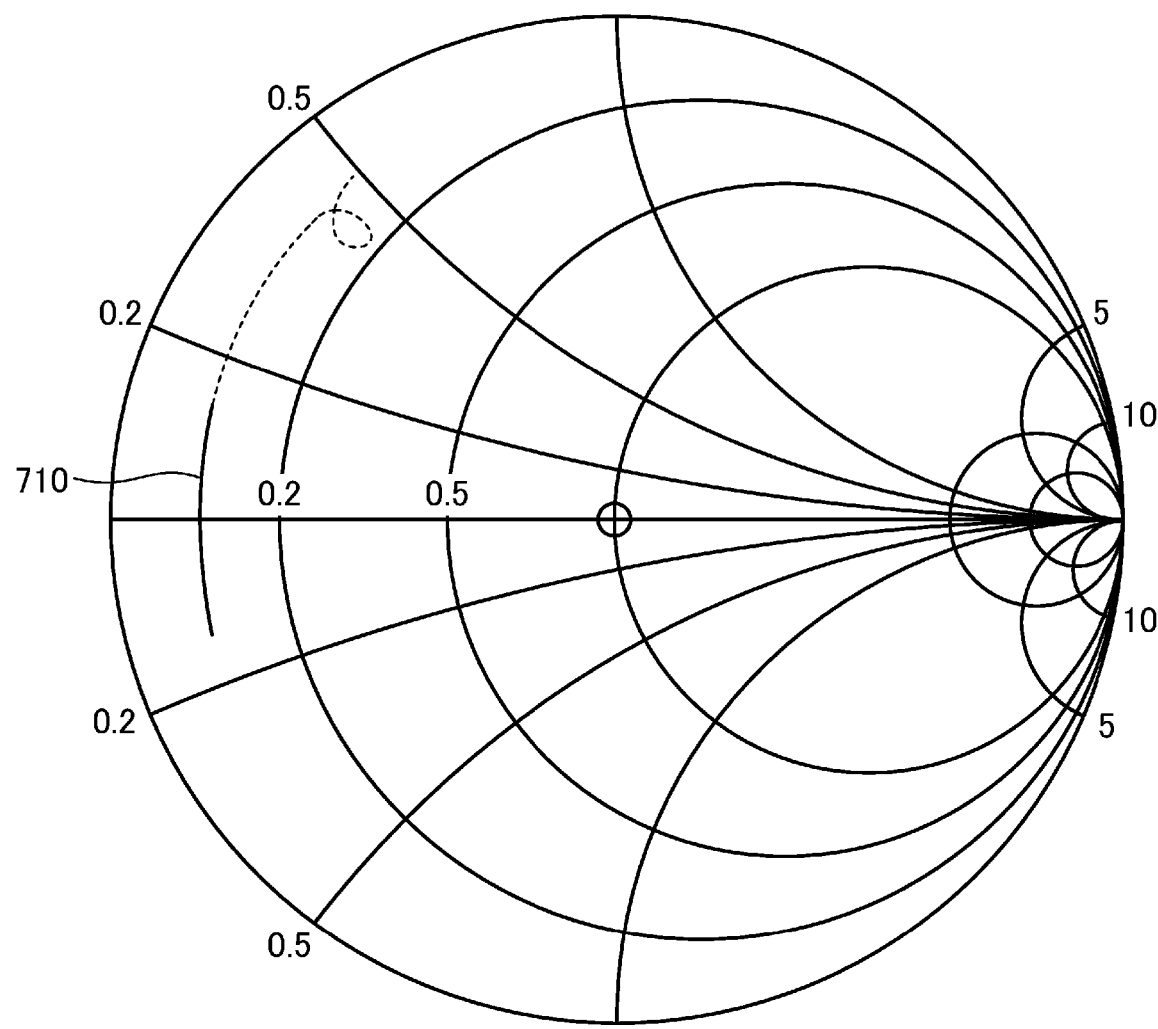
FIG. 9 is a diagram illustrating an example load impedance at a second harmonic.

FIGS. 7 to 9 are diagrams illustrating examples of a load impedance at a second harmonic. When the second harmonic is to be terminated by the series resonant circuit formed by the inductor 226 and the capacitor 228 and the series resonant circuit formed by the inductor 232 and the capacitor 230, the capacitance values of the capacitors 228 and 230 can be increased by decreasing the inductance values of the inductors 226 and 232. If the values of the capacitors 228 and 230 are large, as indicated by line 510 in FIG. 7, the load impedance at the second harmonic can change by a small amount with a change in frequency. In FIG. 7, line 512 indicates a change in load impedance with frequency when the capacitance value is small. The line 512 in FIG. 7 is given for reference.

Further, a double trap circuit is implemented by the series resonant circuit formed by the inductor 226 and the capacitor 228, the series resonant circuit formed by the inductor 232 and the capacitor 230, and the series resonant circuits formed by the two halves of the inductor 244 and the parallel circuit 258. With this circuit configuration, as indicated by line 610 in FIG. 8, the load impedance at the second harmonic can change by a smaller amount with a change in frequency. For example, to achieve an operation in the mid band (for example, 1710 MHz to 2025 MHz) and an operation in the high band (for example, 2300 MHz to 2700 MHz), the switch 252 is brought into the off state, thereby setting, as indicated by the line 610, the load impedance at the second harmonic to be near a short circuit in the high band. The switch 252 is brought into the on state, thereby setting, as indicated by line 710 in FIG. 9, the load impedance at the second harmonic to be near a short circuit in the mid band.

Example Layout

Figure 10:
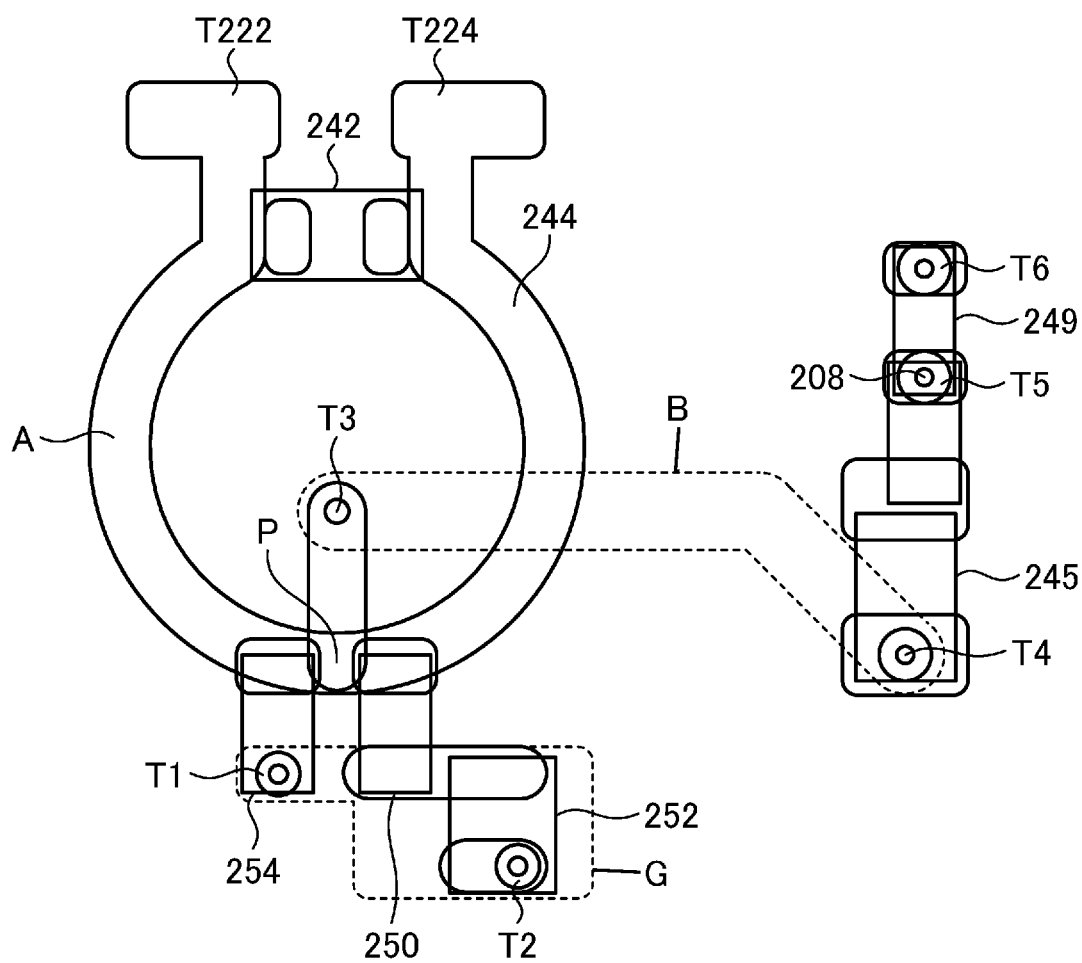
FIG. 10 is a diagram illustrating an example layout in which a portion of the differential amplifier circuit illustrated in FIG. 6 is arranged in a substrate.

An example layout in which the differential amplifier circuit illustrated in FIG. 6 is arranged in a substrate will be described. FIG. 10 is a diagram illustrating an example layout in which a portion of the differential amplifier circuit illustrated in FIG. 6 is arranged in a substrate. FIG. 10 illustrates an example layout of the inductor 244 of the differential amplifier circuit illustrated in FIG. 6 and its neighboring elements. In the illustrated example, the differential amplifier circuit is implemented using a multi-layer substrate. In FIG. 10, a pattern depicted by a solid line and a pattern depicted by a broken line are disposed in different layers.

In FIG. 10, a terminal T222 is connected to the output side of the amplifier 222 illustrated in FIG. 6. A terminal T224 is connected to the amplifier 224 illustrated in FIG. 6. A capacitor 242 is disposed between the terminal T222 and the terminal T224, and substantially the same electrical connection relationship as that illustrated in FIG. 6 is achieved.

The inductor 244 is disposed between the terminal T222 and the terminal T224. In this example, the pattern of the inductor 244 has a substantially circular arc portion A. A midpoint P of the substantially circular arc portion A of the inductor 244 corresponds to the midpoint P illustrated in FIG. 6. The capacitors 254 and 250 are connected to the midpoint P of the inductor 244 corresponding to the primary winding of the transformer TR2, and the inductor 244 illustrated in FIG. 10 has substantially the same electrical connection relationship as that illustrated in FIG. 6.

One end of the capacitor 254 is connected to the midpoint P. Another end of the capacitor 254 is connected to a terminal T1. The terminal T1 is connected to a pattern G of the reference potential disposed in a different layer. An end of the capacitor 250 is connected to a terminal T2 via the switch 252. The terminal T2 is connected to the pattern G of the reference potential disposed in the different layer. In this manner, the capacitor 254, the capacitor 250, and the switch 252 have substantially the same electrical connection relationship as that illustrated in FIG. 6. An end of the capacitor 254 and an end of the capacitor 250 are connected directly to the midpoint P without the intervention of an inductor or the like.

The midpoint P of the inductor 244 is electrically connected to a terminal T3. The terminal T3 is disposed inside the substantially circular arc portion A. The terminal T3 is connected to one end of a pattern B disposed in a different layer. Another end of the pattern B is connected to a terminal T4. The terminal T4 is disposed in an outer side portion of the substantially circular arc portion A.

The choke inductor 245 is disposed in the same layer as that of the inductor 244. One end of the choke inductor 245 is connected to the terminal T4. Another end of the choke inductor 245 is connected to a terminal T5 of the power supply voltage VCC1. The terminal T5 of the power supply voltage VCC1 is connected to a terminal T6 of the reference potential via a capacitor 249.

As described above, an end of the capacitor 254 and an end of the capacitor 250 are connected directly to the midpoint P without the intervention of an inductor or the like. This allows a resonant frequency to be set to a desired value without any influence of the floating inductance caused by wiring.

In FIG. 10, the inductor 246, which is electromagnetically coupled to the inductor 244, is not illustrated. The inductor 246 is disposed in a different layer from that of the inductor 244, for example.

Example Resonant Frequency

Figure 11:
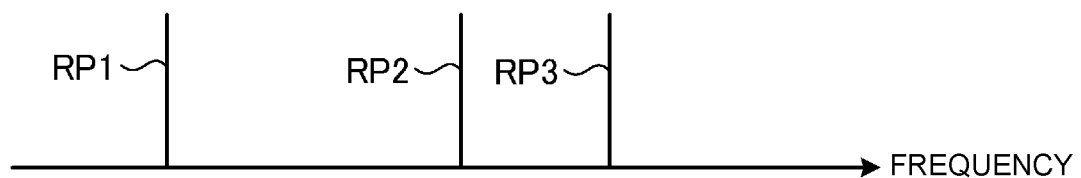
FIG. 11 is a diagram illustrating example resonant frequencies of resonant circuits in the differential amplifier circuit illustrated in FIG. 6.

FIG. 11 is a diagram illustrating example resonant frequencies of resonant circuits in the differential amplifier circuit illustrated in FIG. 6. In FIG. 11, for convenience of illustration, the center values of resonant frequencies RP1, RP2, and RP3 are illustrated. An actual filter characteristic implemented by a resonant circuit has a range of frequencies. In particular, setting a capacitance value to a relatively large value achieves a filter characteristic that varies slowly.

In FIG. 11, the resonant frequency RP1 is the resonant frequency of a resonant circuit formed by one half of the inductor 244 and the capacitors 254 and 250. For example, one half of the inductance value of the inductor 244 and the capacitance values of the capacitors 254 and 250 are determined so that the resonant frequency RP1 becomes 3700 MHz, thereby preventing the second harmonic (i.e., 3700 MHz) of 1850 MHz, which is approximately the middle value of the mid-band frequency band in the range of 1710 MHz to 2025 MHz, from being outputted. Each resonant circuit may have a resonant frequency that is slightly shifted from the second harmonic frequency.

The resonant frequency RP2 is the resonant frequency of a resonant circuit formed by one half of the inductor 244 and the capacitor 254. For example, one half of the inductance value of the inductor 244 and the capacitance value of the capacitor 254 are determined so that the resonant frequency RP2 becomes 4600 MHz, thereby preventing the second harmonic (i.e., 4600 MHz) of 2300 MHz, which is a frequency in the high band, from being outputted.

The resonant frequency RP3 is the resonant frequency of a resonant circuit formed by the inductor 226 and the capacitor 228 and the resonant frequency of a resonant circuit formed by the inductor 232 and the capacitor 230. For example, the inductance value of the inductor 226 and the capacitance value of the capacitor 228, and the inductance value of the inductor 232 and the capacitance value of the capacitor 230 are determined so that the resonant frequency RP3 becomes 5400 MHz, thereby preventing the second harmonic (i.e., 5400 MHz) of 2700 MHz, which is a frequency in the high band, from being outputted.

According to the fifth embodiment described above, a differential amplifier circuit with a wide operating frequency range can be implemented.

Sixth Embodiment

Figure 12:
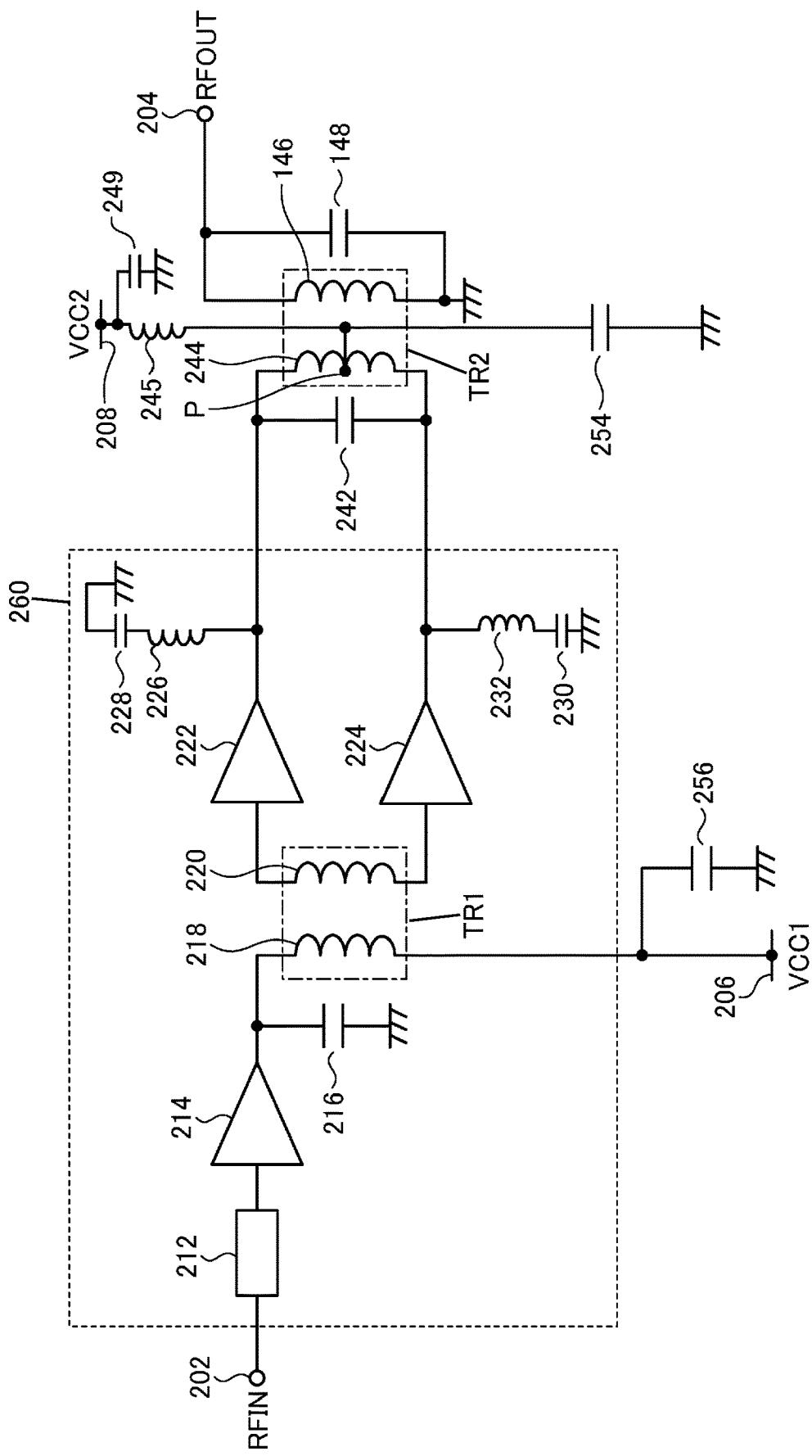
FIG. 12 is a diagram illustrating a differential amplifier circuit according to a sixth embodiment of the present disclosure.

FIG. 12 is a diagram illustrating a differential amplifier circuit according to a sixth embodiment of the present disclosure. In FIG. 12, the differential amplifier circuit according to the sixth embodiment does not include the capacitor 250 or the switch 252 in the first embodiment. Accordingly, a series resonant circuit formed by one half of the inductor 244 and the capacitor 254 has a fixed resonant frequency.

Figure 13:
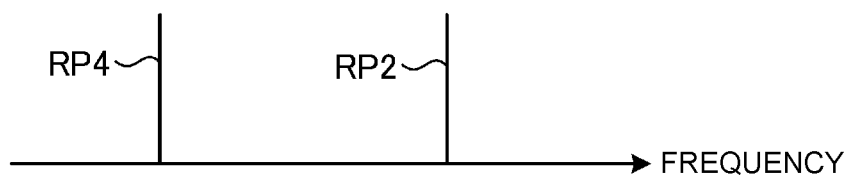
FIG. 13 is a diagram illustrating example resonant frequencies of resonant circuits in the differential amplifier circuit illustrated in FIG. 12.

FIG. 13 is a diagram illustrating example resonant frequencies of resonant circuits in the differential amplifier circuit illustrated in FIG. 12. In FIG. 13, for convenience of illustration, the center values of resonant frequencies RP2 and RP4 are illustrated. An actual filter characteristic implemented by a resonant circuit has a range of frequencies. In particular, setting an inductance value to a relatively large value achieves a filter characteristic that varies slowly.

In FIG. 13, the resonant frequency RP2 has been described above. A resonant frequency RP4 is the resonant frequency of a resonant circuit formed by one half of the inductor 244 and the capacitor 254. For example, one half of the inductance value of the inductor 244 and the capacitance value of the capacitor 254 are determined so that the resonant frequency RP4 becomes 3700 MHz, thereby preventing the second harmonic (i.e., 3700 MHz) of 1850 MHz, which is approximately the middle value of the mid-band frequency band in the range of 1710 MHz to 2025 MHz, from being outputted.

Seventh Embodiment

Figure 14:
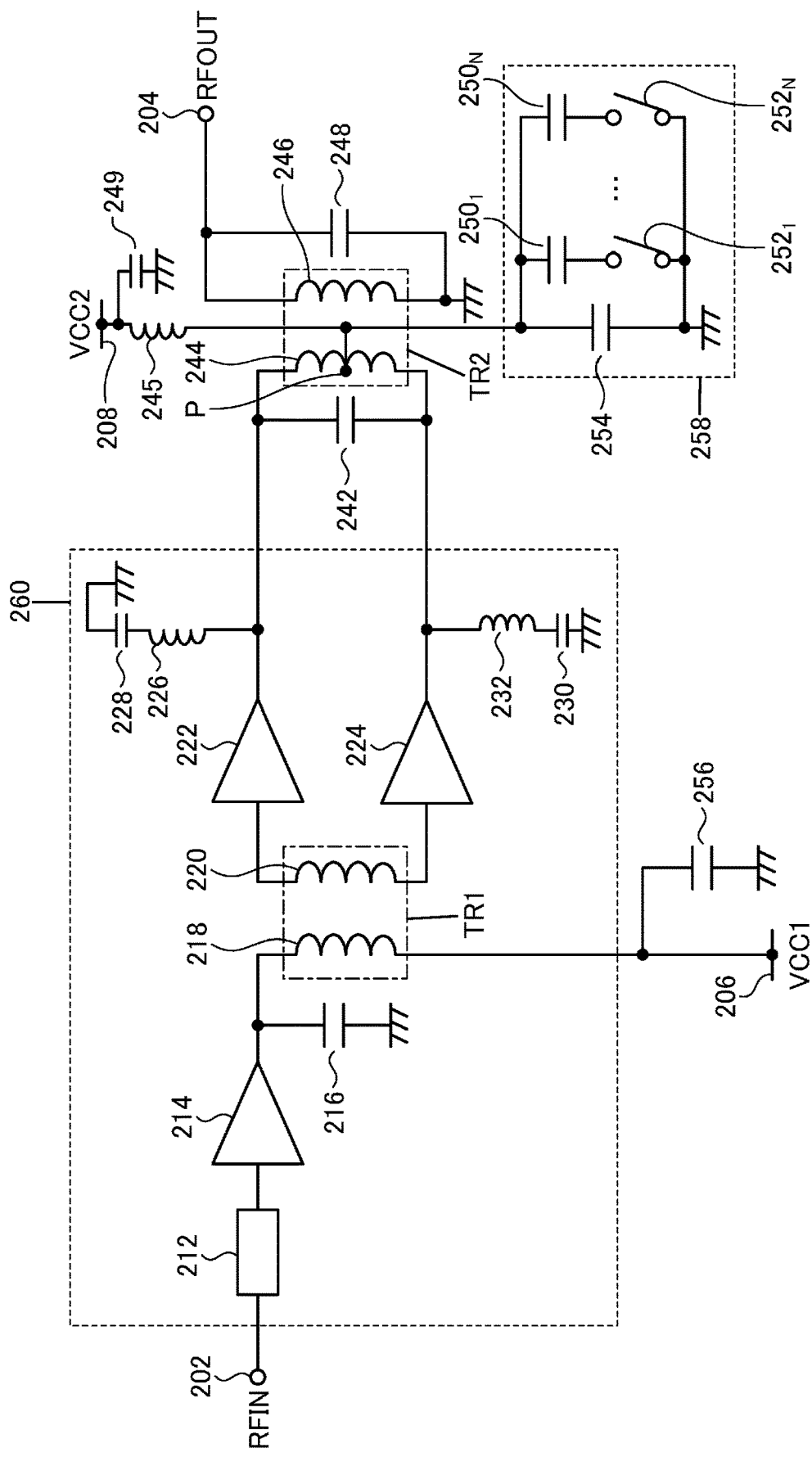
FIG. 14 is a diagram illustrating a differential amplifier circuit according to a seventh embodiment of the present disclosure.

FIG. 14 is a diagram illustrating a differential amplifier circuit according to a seventh embodiment of the present disclosure. In FIG. 14, the differential amplifier circuit according to the seventh embodiment includes a plurality of capacitors 250 and a plurality of switches 252, each of the capacitors 250 and each of the switches 252 respectively corresponding to the capacitor 250 and the switch 252 according to the fifth embodiment. Specifically, the differential amplifier circuit according to the seventh embodiment includes N capacitors $250_1, \ldots,$ and $250_N$ and N switches $252_1, \ldots,$ and $252_N$, where N is an integer greater than or equal to 2. The ends of the capacitors $250_i$ are connected to the ends of the switches $252_i$, where i is an integer from 1 to N. The other ends of the capacitors $250_i$ are connected to one end of the capacitor 254. The other ends of the switches $252_i$ are connected to another end of the capacitor 254.

The switches $252_i$ are brought into the on or off state to connect a corresponding one or more of the capacitors $250_1, \ldots,$ and $250_N$ in parallel to the capacitor 254. Accordingly, the switches $252_i$ are brought into the on or off state, thereby changing the number of capacitors to be connected in parallel to the capacitor 254 among the parallel-connected capacitors $250_1, \ldots,$ and $250_N$ and determining a composite capacitance value. The switches $252_1, \ldots,$ and $252_N$ can be implemented by transistors, for example. The switches $252_1, \ldots,$ and $252_N$ are controlled to turn on or off in accordance with the operating frequencies of the amplifiers 222 and 224.

Figure 15:
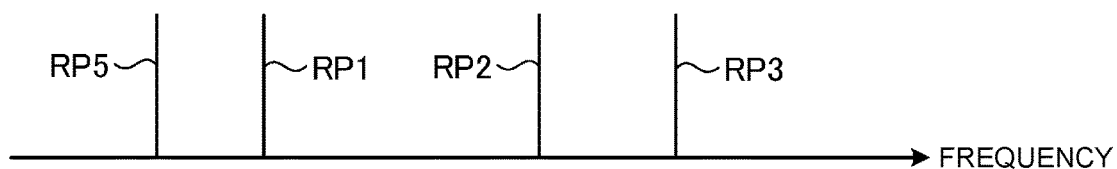
FIG. 15 is a diagram illustrating example resonant frequencies of resonant circuits in the differential amplifier circuit illustrated in FIG. 14.

FIG. 15 is a diagram illustrating example resonant frequencies of resonant circuits in the differential amplifier circuit illustrated in FIG. 14. In FIG. 15, for convenience of illustration, the center values of resonant frequencies RP1, RP2, RP3, and RP5 are illustrated. An actual filter characteristic implemented by a resonant circuit has a range of frequencies. In particular, setting a capacitance value to a relatively large value achieves a filter characteristic that varies slowly.

In FIG. 15, the resonant frequencies RP1 to RP3 have been described above. A resonant frequency RP5 is the resonant frequency of a resonant circuit formed by one half of the inductor 244, the capacitor 254, and the capacitors $250_1, \ldots,$ and $250_N$ connected in parallel to the capacitor 254. One half of the inductance value of the inductor 244 and the capacitance values of the capacitor 254 and the capacitors $250_1, \ldots,$ and $250_N$ are determined, thereby preventing the second harmonic (i.e., 1200 MHz to 1830 MHz) of 600 MHz to 915 MHz in the low band from being outputted.

Summary of Fifth to Seventh Embodiments

In the fifth to seventh embodiments described above, the series resonant circuit formed by the inductor 226 and the capacitor 228 is disposed on the output end of the amplifier 222. The series resonant circuit formed by the inductor 232 and the capacitor 230 is disposed on the output end of the amplifier 224. These series resonant circuits can implement a desired resonant frequency. While preferred embodiments of the disclosure have been described above, it is to be understood that variations and modifications will be apparent to those skilled in the art without departing from the scope and spirit of the disclosure. The scope of the disclosure, therefore, is to be determined solely by the following claims.

What is claimed is:

1. A differential amplifier circuit comprising:
a first amplifier and a second amplifier that output a differential signal in a radio-frequency band;
a first inductor having a first end connected to an output end of the first amplifier, and a second end;
a second inductor having a first end connected to an output end of the second amplifier, and a second end, the second end of the first inductor and the second end of the second inductor being connected to each other;
a choke inductor connected to the second end of the first inductor and the second end of the second inductor;
a first capacitor having a first end connected to the second end of the first inductor and the second end of the second inductor, and a second end connected to a reference potential;
a second capacitor; and
a switch that selectively connects the second capacitor in parallel to the first capacitor or terminates a parallel connection of the first capacitor and the second capacitor, wherein
the first inductor or the second inductor is connected in series with the first capacitor to form a resonant circuit having a first resonant frequency, and the first inductor or the second inductor is connected in series with the first capacitor and the second capacitor that are connected in parallel to form a resonant circuit having a second resonant frequency, the first resonant frequency and the second resonant frequency being different from each other, and
the first resonant frequency and the second resonant frequency correspond to second harmonic frequencies of the differential signal.

2. The differential amplifier circuit according to claim 1, further comprising
a transformer having a primary winding and a secondary winding that are electromagnetically coupled to each other, the transformer being configured to perform balanced-to-unbalanced conversion, wherein
the first inductor and the second inductor are implemented using the primary winding of the transformer, and
the second end of the first inductor and the second end of the second inductor correspond to a midpoint of the primary winding.

3. The differential amplifier circuit according to claim 1, further comprising
a transformer having a primary winding and a secondary winding that are electromagnetically coupled to each other, the transformer being configured to perform balanced-to-unbalanced conversion, wherein
the first inductor and the second inductor are connected in parallel to the primary winding of the transformer.

4. The differential amplifier circuit according to claim 1, wherein
the first inductor and the second inductor have the same inductance value.

5. The differential amplifier circuit according to claim 1, wherein
the first inductor and the second inductor are connected to a power supply voltage via the choke inductor.

6. The differential amplifier circuit according to claim 1, wherein
the first resonant frequency is equal to the second harmonic frequencies of the differential signal.

7. The differential amplifier circuit according to claim 1, further comprising:
a first series resonant circuit having a first end connected to the output end of the first amplifier, and a second end connected to the reference potential; and
a second series resonant circuit having a first end connected to the output end of the second amplifier, and a second end connected to the reference potential, wherein
each of the first series resonant circuit and the second series resonant circuit includes an inductor and a capacitor that are connected in series, and
a resonant frequency of the first series resonant circuit and a resonant frequency of the second series resonant circuit are different from the first resonant frequency and the second resonant frequency.

8. The differential amplifier circuit according to claim 2, further comprising:
a first series resonant circuit having a first end connected to the output end of the first amplifier, and a second end connected to the reference potential; and
a second series resonant circuit having a first end connected to the output end of the second amplifier, and a second end connected to the reference potential, wherein
each of the first series resonant circuit and the second series resonant circuit includes an inductor and a capacitor that are connected in series, and
a resonant frequency of the first series resonant circuit and a resonant frequency of the second series resonant circuit are different from the first resonant frequency and the second resonant frequency.

9. The differential amplifier circuit according to claim 3, further comprising:
a first series resonant circuit having a first end connected to the output end of the first amplifier, and a second end connected to the reference potential; and
a second series resonant circuit having a first end connected to the output end of the second amplifier, and a second end connected to the reference potential, wherein
each of the first series resonant circuit and the second series resonant circuit includes an inductor and a capacitor that are connected in series, and
a resonant frequency of the first series resonant circuit and a resonant frequency of the second series resonant circuit are different from the first resonant frequency and the second resonant frequency.

10. A differential amplifier circuit comprising:
a first amplifier and a second amplifier that output a differential signal in a radio-frequency band;
a first inductor having a first end connected to an output end of the first amplifier, and a second end;
a second inductor having a first end connected to an output end of the second amplifier, and a second end, the second end of the first inductor and the second end of the second inductor being connected to each other;
a choke inductor connected to the second end of the first inductor and the second end of the second inductor;

a first capacitor having a first end connected to the second end of the first inductor and the second end of the second inductor, and a second end connected to a reference potential;

a first series resonant circuit having a first end connected to the output end of the first amplifier, and a second end connected to the reference potential; and a second series resonant circuit having a first end connected to the output end of the second amplifier, and a second end connected to the reference potential, wherein each of the first series resonant circuit and the second series resonant circuit includes an inductor and a capacitor that are connected in series, the first inductor or the second inductor is connected in series with the first capacitor to form a resonant circuit having a first resonant frequency, and each of the first series resonant circuit and the second series resonant circuit has a second resonant frequency, the first resonant frequency and the second resonant frequency being different from each other, and the first resonant frequency and the second resonant frequency correspond to second harmonic frequencies of the differential signal.

11. The differential amplifier circuit according to claim 7, wherein the first amplifier, the second amplifier, the first series resonant circuit, and the second series resonant circuit are disposed in the same semiconductor chip.

12. The differential amplifier circuit according to claim 10, wherein the first amplifier, the second amplifier, the first series resonant circuit, and the second series resonant circuit are disposed in the same semiconductor chip.

13. The differential amplifier circuit according to claim 10, further comprising:

a second capacitor; and a switch that selectively connects the second capacitor in parallel to the first capacitor or terminates a parallel connection of the first capacitor and the second capacitor.

14. The differential amplifier circuit according to claim 10, wherein the first inductor and the second inductor have the same inductance value.

15. The differential amplifier circuit according to claim 10, wherein the first inductor and the second inductor are connected to a power supply voltage via the choke inductor.

16. The differential amplifier circuit according to claim 10, wherein the first resonant frequency and the second resonant frequency are equal to the second harmonic frequencies of the differential signal.

17. A differential amplifier circuit comprising:

a first amplifier and a second amplifier that output a differential signal in a radio-frequency band;

a first inductor having a first end connected to an output end of the first amplifier, and a second end;

a second inductor having a first end connected to an output end of the second amplifier, and a second end, the second end of the first inductor and the second end of the second inductor being connected to each other;

a choke inductor connected to the second end of the first inductor and the second end of the second inductor;

a third inductor disposed in parallel to the first inductor and the second inductor, the third inductor having a first end connected to the output end of the first amplifier, and a second end connected to the output end of the second amplifier;

a first capacitor having a first end connected to a midpoint of the third inductor, and a second end connected to a reference potential;

a transformer having a primary winding and a secondary winding that are electromagnetically coupled to each other, the transformer being configured to perform balanced-to-unbalanced conversion, the primary winding of the transformer being used to implement the first inductor and the second inductor; and a series resonant circuit including one half of the third inductor and the first capacitor.

18. The differential amplifier circuit according to claim 17, wherein the first inductor and the second inductor have the same inductance value.

19. The differential amplifier circuit according to claim 17, wherein the first inductor and the second inductor are connected to a power supply voltage via the choke inductor.

20. The differential amplifier circuit according to claim 17, wherein the series resonant circuit is configured to prevent second harmonics from being outputted.

* * * * *

UNITED STATES PATENT AND TRADEMARK OFFICE
CERTIFICATE OF CORRECTION

| | |
|---|---|
| PATENT NO. | : 11,901,867 B2 |
| APPLICATION NO. | : 17/350385 |
| DATED | : February 13, 2024 |
| INVENTOR(S) | : Yuri Honda et al. |

It is certified that error appears in the above-identified patent and that said Letters Patent is hereby corrected as shown below:

In the Specification

Column 12, Line 33, "252" should be -- $252_i$ --.

Signed and Sealed this
Twenty-fourth Day of December, 2024

Derrick Brent
*Acting Director of the United States Patent and Trademark Office*